(12) United States Patent
Umemoto et al.

(10) Patent No.: US 6,690,073 B2
(45) Date of Patent: Feb. 10, 2004

(54) SEMICONDUCTOR INTEGRATED CIRCUIT MAKING USE OF STANDARD CELLS

(75) Inventors: Yasunobu Umemoto, Kanagawa-ken (JP); Toshikazu Sei, Kanagawa-ken (JP); Toshiki Morimoto, Kanagawa-ken (JP); Hiroaki Suzuki, Kanagawa-ken (JP)

(73) Assignee: Kabushiki Kaisha Toshiba (JP)

( * ) Notice: Subject to any disclaimer, the term of this patent is extended or adjusted under 35 U.S.C. 154(b) by 80 days.

(21) Appl. No.: 09/819,532

(22) Filed: Mar. 27, 2001

(65) Prior Publication Data

US 2001/0028069 A1 Oct. 11, 2001

(30) Foreign Application Priority Data

Mar. 27, 2000 (JP) .................................... P2000-087679

(51) Int. Cl.⁷ .............................................. H01L 29/76
(52) U.S. Cl. .................. 257/390; 257/202; 257/207; 257/206; 257/208; 257/368; 257/369
(58) Field of Search ................... 257/202, 207, 257/208, 206, 368, 390, 274, 357, 369

(56) References Cited

U.S. PATENT DOCUMENTS

| | | | | |
|---|---|---|---|---|
| 4,803,178 A | * | 2/1989 | McCaughan | 438/128 |
| 5,136,356 A | * | 8/1992 | Sakuda et al. | 257/211 |
| 5,369,596 A | * | 11/1994 | Tokumaru | 716/19 |
| 5,404,034 A | * | 4/1995 | Yin | 257/206 |
| 5,452,245 A | * | 9/1995 | Hickman et al. | 365/154 |
| 5,780,883 A | * | 7/1998 | Tran et al. | 257/206 |
| 5,917,207 A | * | 6/1999 | Colwell et al. | 257/206 |
| 5,990,502 A | * | 11/1999 | Park | 257/202 |
| 6,091,090 A | * | 7/2000 | Gheewala | 257/211 |
| 6,140,687 A | * | 10/2000 | Shimomura et al. | 257/401 |
| 6,160,275 A | * | 12/2000 | Nishio et al. | 257/206 |
| 6,396,087 B1 | * | 5/2002 | Kitabayashi et al. | 257/207 |
| 6,462,978 B2 | * | 10/2002 | Shibata et al. | 365/63 |

FOREIGN PATENT DOCUMENTS

| | | | | |
|---|---|---|---|---|
| JP | 01278743 | * | 11/1989 | |
| JP | 02189951 | * | 7/1990 | 257/207 |
| JP | 03222457 | * | 10/1991 | 361/772 |
| JP | 09148443 | * | 6/1997 | |

OTHER PUBLICATIONS

Cpending U. S. patent application Ser. No. 09/665,943, filed Sep. 21, 2000.

* cited by examiner

*Primary Examiner*—Eddie Lee
*Assistant Examiner*—Eugene Lee
(74) *Attorney, Agent, or Firm*—Gray Cary Ware & Friedenrich LLP

(57) ABSTRACT

A semiconductor integrated circuit which is capable of being manufactured with a higher packing density and a small-size structure of standard cells is described. In the semiconductor integrated circuit, substrate regions and source regions are shared by adjacent standard cells as well as common contact regions which are located inward displaced respectively from the centers of the substrate regions.

7 Claims, 7 Drawing Sheets

PRIOR ART

NO MISALIGNMENT

MISALIGNED UPWARD

SEMICONDUCTOR INTEGRATED CIRCUIT MAKING USE OF STANDARD CELLS

CROSS REFERENCE TO RELATED APPLICATIONS

This application claims benefit of priority under 35 USC §119 to Japanese Patent Application No.2000-87679, filed on Mar. 27, 2000, the entire contents of which are incorporated by reference herein.

BACKGROUND OF THE INVENTION

1. Field of the Invention

The present invention is related generally to a semiconductor integrated circuit making use of standard cells.

2. Prior Art

In the case of the conventional approach to the design of semiconductor integrated circuits making use of standard cells, a plurality of types of standard cells having the same cell height are prepared and arranged in cell rows as part of the integrated circuit. It is, therefore, desirable for the sizes of the respective standard cells to be small in order to realize a higher packing densities of integrated circuits making use of standard cells. However, there occurrs a tradeoff to be made between the cell size and the driving power of the cell when the cell size is decreased by decreasing the size of the constituent transistors. One solution of the shortcomings is disclosed in Japanese Patent Application Hei 11-269484 in which part of a standard cell is shared with an adjacent standard cell in order to virtually reduce the cell size.

FIG. 1 is a schematic diagram showing the configuration of the semiconductor integrated circuit in accordance with the above described conventional technique in which (a) of the same figure is a plan view showing a standard cell constituting a 2-input NAND gate; (b) is a plan view showing a standard cell constituting an inverter; and (c) is a plan view showing the 2-input NAND gate as illustrated in FIG. 1(a) and the inverter as illustrated in FIG. 1(b) which are located adjacent to each other and combined with each other. Meanwhile, in FIG. 1, illustration of metallic wiring layers are dispensed with for the sake of clarity in explanation while illustrating the source regions, polysilicon layers, contact regions and the cell boundary lines (cell box) indicative of the respective cell areas, while illustrating source regions, polysilicon layers, contact regions and a cell boundary line (cell box) indicative of the cell area and the location of the gate electrodes are illustrated with bold lines. Also, not shown in the figure, substrate regions are provided between and shared by cells adjacent to each other in the longitudinal (vertical) direction and arranged in order to form cell rows. A plurality of standard cell rows are arranged in parallel so that a number of standard cells are arranged in the longitudinal and lateral directions and combined with the cell boundary lines as aligned to each other in order to implement predetermined functions.

As illustrated in FIG. 1(a), source regions 105, 106 and 107 are located beyond the cell boundary line 109 as well as part of the contact regions 101, 102 and 103. The source regions 105, 106 and 107 and the contact regions 101, 102 and 103 are located in the both sides of the cell. Also, there is provided a shared region 108 where the source region of an adjacent cell is formed as well as a contact region 104. In the case of the inverter cell as illustrated in FIG. 1(b), the source region 110 and the contact region 111 are located beyond the cell boundary line 114, i.e., located in shared regions. When the NAND circuit as illustrated in FIG. 1(a) and the inverter cell as illustrated in FIG. 1(b) are located adjacent to each other as illustrated in FIG. 1(c), the source region 106 and the contact region 102 of the NAND circuit and the source region 110 and the contact region 111 of the inverter cell are united and shared by the NAND circuit and the inverter cell. The source region 112 inclusive of the contact region 113 as shared by the adjacent cells are formed including a concave area.

Since the source regions and the contact regions thereof are shared by adjacent standard cells, the length of the cell row is decreased in the lateral direction so that the effective size of each standard cell can be reduced.

While the conventional technique is very effective in the case of small-sized cells (i.e., having narrow widths while the standard cells in a cell row have the same height in the longitudinal direction), the advantages is diminished as the size increases. In the case of a standard cell having a certain width, the cell size sometimes becomes smaller by providing private substrate regions than that when the standard cell shares substrate regions with adjacent cells.

SUMMARY OF THE INVENTION

In brief, the above and other objects and advantages of the present invention are provided by a new and improved semiconductor integrated circuit including a plurality of standard cells which are arranged adjacent to each other in a cell row and composed of a plurality of MOS transistors, each standard cell of said cell row being provided with at least one first contact region through which at least one of said MOS transistors is electrically connected to a power potential, at least one second contact region through which at least one of said MOS transistors is electrically connected to a ground potential and first and second substrate regions located in upper and lower sides of the standard cell, wherein said first substrate region is provided with at least one contact region through which said first substrate is electrically connected to said power potential while said second substrate region is provided with at least one contact region through which said second substrate is electrically connected to said ground potential, wherein said first substrate region of said each standard cell is joined to the first substrate region of an adjacent cell of said cell row located adjacent to said each standard cell in order to form a first continuous region extending along said cell row in parallel while the second substrate region of said each standard cell is joined to the second substrate region of said adjacent cell in order to form a second continuous region extending along said cell row in parallel, wherein said first contact region of said each standard cell is located beyond the boundary line between said each standard cell and said adjacent cell and shared by said each standard cell and said adjacent cell to function also as the first contact region of said adjacent cell, wherein said at least one contact region of said first substrate region of said each standard cell is located to be inwardly displaced from the centers of said first substrate region in the longitudinal direction at the location where said first substrate region has a minimum width and functions also as said first contact region of said each standard cell, and wherein said at least one contact region of said second substrate region of said each standard cell is located to be inwardly displaced from the centers of said second substrate region in the longitudinal direction at the location where said second substrate region has a minimum width and functions also as said second contact region of said each standard cell.

In a preferred embodiment, further improvement resides in that there is a vacant area where no functional cell is arranged in said cell row.

In a preferred embodiment, further improvement resides in that said vacant area is padded with an inoperative cell which causes no operation.

In a preferred embodiment, further improvement resides in that said inoperative cell is provided with a substrate region and a contact region.

In a preferred embodiment, further improvement resides in that the widths of said first and second substrate regions have widths narrower than that as required for forming contact regions thereon under constraints determined by manufacture processes.

In a preferred embodiment, further improvement resides in that the perimeters of said contact regions of said first and second substrate regions are displaced from the center positions of the substrate regions of said first and second substrate regions by an interval no narrower than one half of a minimum allowable interval for complying with mask design rules.

In accordance with another aspect of the present invention, an improved semiconductor integrated circuit includes a plurality of standard cells which are arranged adjacent to each other in a cell row and composed of a plurality of MOS transistors, each standard cell of said cell row being provided with at least one first contact region through which at least one of said MOS transistors is electrically connected to a power potential, at least one second contact region through which at least one of said MOS transistors is electrically connected to a ground potential and first and second substrate regions located in upper and lower sides of the standard cell, wherein said first substrate region of said each standard cell is joined to the first substrate region of an adjacent cell of said cell row located adjacent to said each standard cell within said each cell row in order to form a first substrate continuous region extending along said cell row in parallel while the second substrate region of said each standard cell is joined to the second substrate region of said adjacent cell in order to form a second substrate continuous region extending along said cell row in parallel, wherein said first substrate continuous region is provided with a plurality of contact regions through which said first substrate is electrically connected to said power potential while said second substrate continuous region is provided with a plurality of contact regions through which said second substrate is electrically connected to said ground potential, wherein said first substrate continuous region is provided with a plurality of expanded regions which are extended inwardly toward said standard cells in the longitudinal direction at the location, and wherein said contact regions of said first substrate continuous region are located in said expanded regions.

In accordance with a further aspect of the present invention, an improved semiconductor integrated circuit includes a plurality of standard cells which are arranged adjacent to each other in a cell row and composed of a plurality of MOS transistors, each standard cell of said cell row being provided with at least one first contact region through which at least one of said MOS transistors is electrically connected to a power potential, at least one second contact region through which at least one of said MOS transistors is electrically connected to a ground potential and first and second substrate regions located in upper and lower sides of the standard cell, wherein said first substrate region of said each standard cell is joined to the first substrate region of an adjacent cell of said cell row located adjacent to said each standard cell within said each cell row in order to form a first substrate continuous region extending along said cell row in parallel while the second substrate region of said each standard cell is joined to the second substrate region of said adjacent cell in order to form a second substrate continuous region extending along said cell row in parallel, wherein said first substrate continuous region is provided with a plurality of contact regions through which said first substrate is electrically connected to said power potential while said second substrate continuous region is provided with a plurality of contact regions through which said second substrate is electrically connected to said ground potential, wherein said first substrate continuous region is provided with a plurality of expanded regions which are extended inwardly toward said standard cells in the longitudinal direction at the location, and wherein said expanded regions are formed in spaces which said standard cell can afford.

BRIEF DESCRIPTION OF DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION OF EMBODIMENTS

Figure 1A:
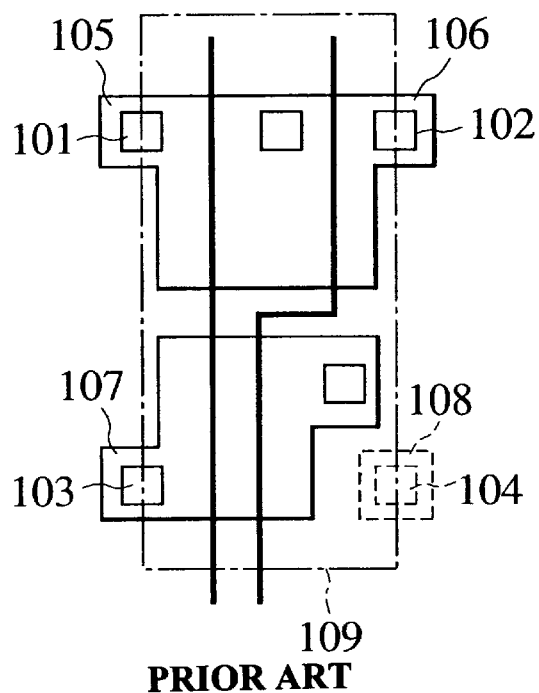
FIG. 1 is a schematic diagram showing the configuration of a semiconductor integrated circuit in accordance with a conventional technique
Figure 1B:
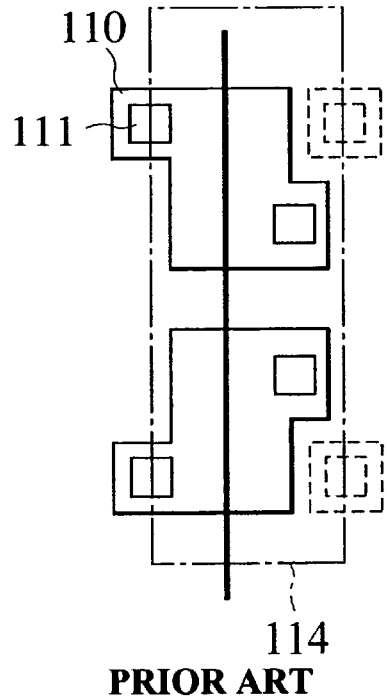
Figure 1C:
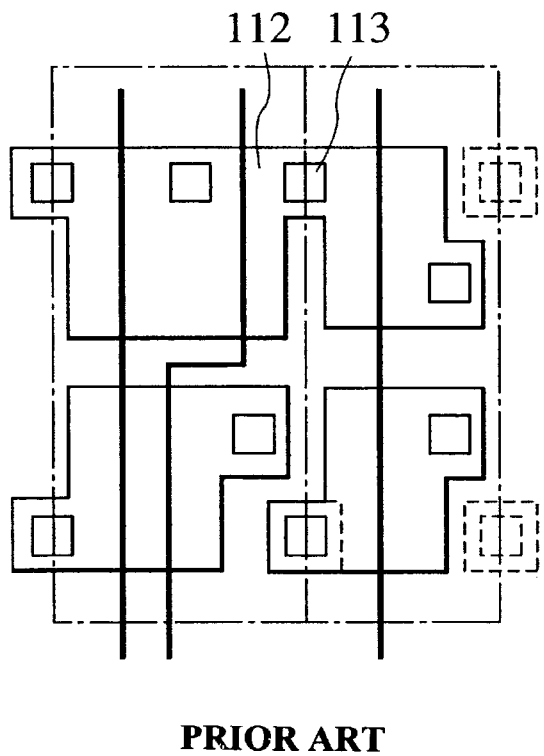
Figure 2:
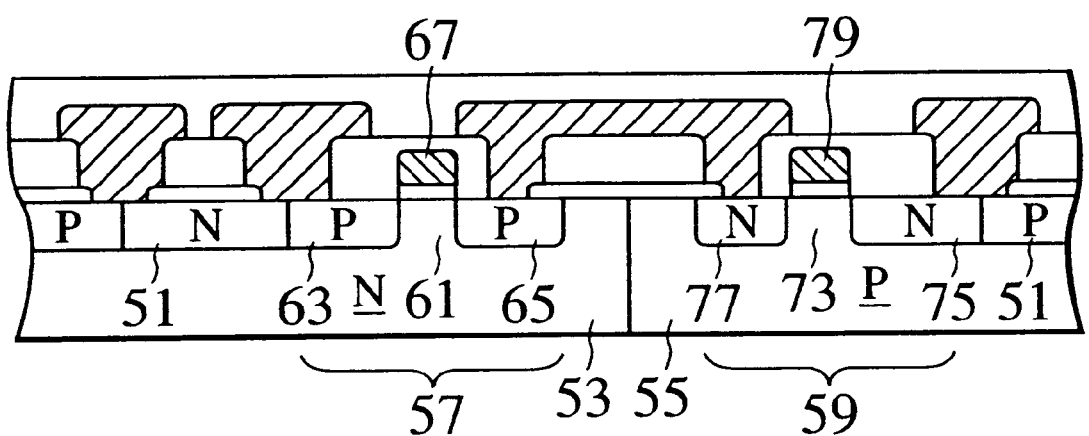
FIG. 2 is a schematic cross section partial view showing a pair of complementary MOS transistors relating to the standard cells implemented with the semiconductor integrated circuit in accordance with the present invention.

Various embodiments of the present invention will be described with reference to the accompanying drawings. First, the basic feature of the present invention will be explained with reference to schematic views showing the general structure of the standard cells in accordance with the present invention. FIG. 2 is a schematic cross section partial view showing a pair of complementary MOS transistors relating to the standard cells implemented with the semiconductor integrated circuit in accordance with the present invention.

As illustrated in FIG. 2, the semiconductor integrated circuit in accordance with the present invention is composed of a semiconductor substrate in which are formed an N-type well region 53 doped with an N-type impurity, a P-type well region 55 doped with a P-type impurity and a pair of substrate regions 51 between which are located the N-type well region 53 and the N-type well region 55. A P-type MOS transistor 57 and an N-type MOS transistor 59 are formed in the N-type well region 53 and the P-type well region 55 respectively between the substrate regions 51.

The P-type MOS transistor 57 is composed of a source region 63 doped with a P-type impurity, a drain region 65 doped with a P-type impurity and a channel region 61 which is located between the source region 63 and the drain region 65 as well as a gate electrode 67 located on the channel region 61 through a gate insulating film. Also, the N-type MOS transistor 59 is composed of a source region 75 doped with an N-type impurity, a drain region 77 doped with an N-type impurity and a channel region 73 which is located between the source region 75 and the drain region 77 as well as a gate electrode 79 located on the channel region 73 through a gate insulating film. In addition to this, necessary conductive layers and insulating layers are formed in order to make necessary electrical connections therebetween.

These substrate regions 51, the P-type MOS transistor 57 and the N-type MOS transistor 59 are formed by known techniques including photolithographic processes. The important features in accordance with the present invention reside in the layout and the respective locations of the respective elements such as the substrate regions 51, the source region 63 and 75 and common contact regions.

Accordingly, the embodiments in accordance with the present invention will be explained in regard to the layout and the respective locations of the respective elements with reference to associated photolithographic etching masks. For example, in the upper half of FIG. 3, the layout of a pair of P-type MOS transistors are illustrated with reference to the associated photolithographic etching masks. In the figure, a solid line M3 is used to indicate the opening of the photolithographic etching mask for ion implantation required to form the several P-type impurity regions of the P-type MOS transistors. Also, a solid line M1 is used to indicate the opening of the photolithographic etching mask for defining the contact regions where the P-type MOS transistors make contact with a power potential. Furthermore, bold lines G are used to indicate the gate electrodes of the P-type MOS transistors. The gate electrodes are used as a mask for forming the regions of the P-type MOS transistors by ion implantation in order to form channel regions under them.

Also, in the lower half of FIG. 3, the layout of a pair of P-type MOS transistors are illustrated with reference to the associated photolithographic etching masks. N-type well region In the figure, a solid line M3 is used to indicate the opening of the photolithographic etching mask for ion implantation required to form the several N-type impurity regions of the N-type MOS transistors. Also, a solid line M1 is used to indicate the opening of the photolithographic etching mask for defining the contact regions where the N-type MOS transistors make contact with a ground level. The gate electrodes as illustrated with the bold lines G are extended passed through the N-type MOS transistors. The gate electrodes are also used as a mask for forming the regions of the N-type MOS transistors by ion implantation in order to form channel regions under them.

Figure 3:
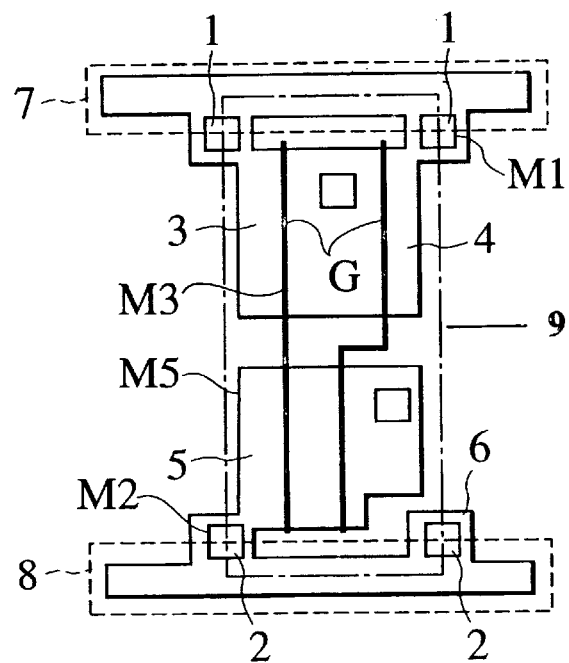
FIG. 3 is a plan view showing the configuration of the semiconductor integrated circuit in accordance with an embodiment of the present invention in which is illustrated a standard cell constituting a 2-input NAND gate.

FIG. 3 is therefore a plan view showing the configuration of the semiconductor integrated circuit in accordance with an embodiment of the present invention in which is illustrated a standard cell constituting a 2-input NAND gate. In FIG. 3, illustration of metallic wiring layers are dispensed with for the sake of clarity in explanation while illustrating source regions, polysilicon layers, contact regions and a cell boundary line (cell box) indicative of the cell area and the location of the gate electrodes are illustrated with bold lines. The source regions 3, 4 and 5 are formed extending beyond the cell boundary line 9. Also, there is provided a shared region 6 where the source region of an adjacent cell is formed as well as a contact region 2. The shared region 6 is functionally not used by the 2-input NAND gate. The substrate regions 7 and 8 are formed extending beyond the cell boundary line 9 and elongated in the lateral direction (in the horizontal direction in FIG. 3) and doped with an impurity having a conductivity type opposite to that of the source regions in the same diffusion layer. In this case, the source regions 3 and 4 are P-type semiconductor regions while the substrate region 7 is an N-type semiconductor region. Also, the source region 5 is an N-type semiconductor regions while the substrate region 8 is a P-type semiconductor region. Particularly, the substrate regions 7 and 8 have widths narrower than the minimum width as required for forming the contact region thereon under constraints determined by the manufacture process. The source regions 3, 4 and 5 and the substrate regions 7 and 8 as joined are shared respectively with three of the four standard cells adjacent thereto in the longitudinal and lateral directions.

Contact regions 1 and 2 are formed on the source regions 3, 4 and 5, the substrate regions 7 and 8 and the shared region 6. These contact regions are provided in order that the source regions 3, 4 and 5, the substrate regions 7 and 8 and the shared region 6 are electrically connected respectively to conductive layers through the contact regions. The contact regions 1 and 2 serve as contacts through which the source regions 3 and 4 are connected to a power potential as well as the substrate region 7. Also, while the contact region 2 located in the shared region 6 serves to provide a contact for the standard cell adjacent to the NAND cell, the other contact region 2 serves as a contact through which both the source region 5 and the substrate region 8 are connected to a ground potential. The contact regions 1 and 2 are located inward displaced respectively from the centers of the substrate regions 7 and 8 in the longitudinal direction (in the vertical direction in FIG. 3) toward the center position of the standard cell at the location where the substrate regions 7 and 8 have minimum widths respectively, and located in order that the center position of each contact region is aligned to the boundary line 9 between the NAND cell and the adjacent standard cell.

Figure 4A:
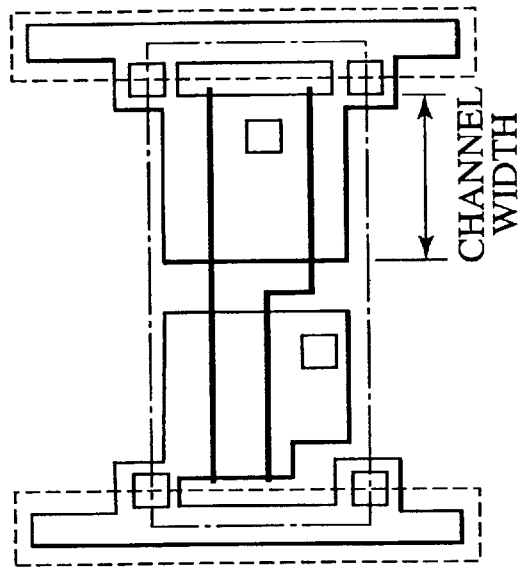
FIG. 4 is an explanatory view for showing the channel width of the semiconductor integrated circuit as illustrated in FIG. 3 as compared with the channel width of the semiconductor integrated circuit of a different configuration.
Figure 4B:
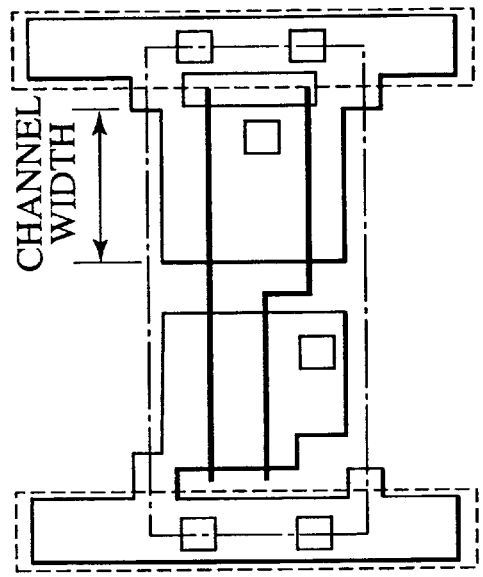

When comparing the layout corresponding to the above described embodiment as illustrated in FIG. 4(a) with the layout as illustrated in FIG. 4(b), the standard cell as illustrated in FIG. 4(a) has a channel width larger than that of the standard cell as illustrated in FIG. 4(b) while these standard cells have the same lateral size. In other words, if the standard cell of the above described embodiment as illustrated in FIG. 4(a) and the standard cell as illustrated in FIG. 4(b) are designed to have the same channel width, the standard cell in accordance with the configuration of FIG. 4(a) has a smaller cell size than the standard cell in accordance with the above described conventional technique as illustrated in FIG. 4(b), making it possible to realize a highly packed structure.

Figure 5:
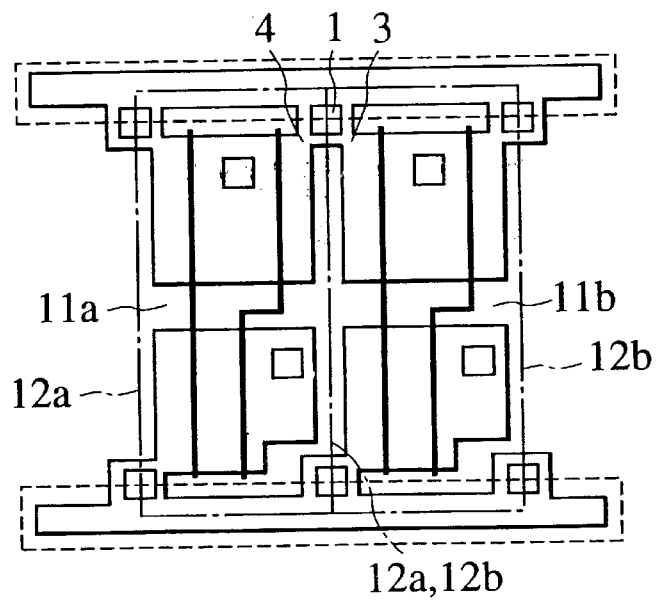
FIG. 5 is a plan view showing the configuration of the semiconductor integrated circuit in which are illustrated two standard cells arranged adjacent to each other in the lateral direction and each of which is designed as illustrated in FIG. 3.

FIG. 5 is a plan view showing the configuration of the semiconductor integrated circuit in which are illustrated two standard cells arranged adjacent to each other in the lateral direction and each of which is designed as illustrated in FIG. 3. In FIG. 5, the respective standard cells 11a and 11b share the source regions 3 and 4 located on the boundary lines 12a and 12b which are joined inbetween. Also, the substrate regions 7 and 8 are formed in the upper and lower positions of the respective standard cells 11a and 11b in order to form two continuous lines.

Namely, the diffusion layers functioning as the source regions and the substrate regions are joined to each other along the respective standard cells while the substrate regions are shared also by the standard cells of the adjacent cell rows.

Figure 6:
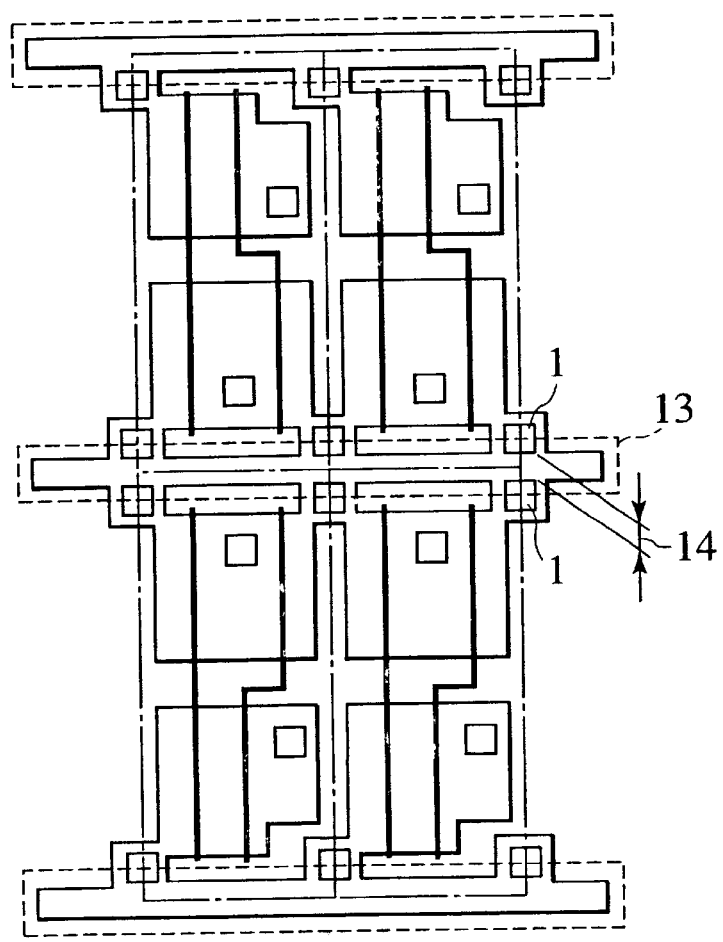
FIG. 6 is a plan view showing the configuration of the semiconductor integrated circuit in which are illustrated two cell rows which are designed as illustrated in FIG. 5, extending in the lateral direction and arranged adjacent to each other in the longitudinal direction.

FIG. 6 is a plan view showing the configuration of the semiconductor integrated circuit in which are illustrated two cell rows which are designed as illustrated in FIG. 5, extending in the lateral direction and arranged adjacent to each other in the longitudinal direction. Meanwhile, in FIG. 6, since the substrate region 13 is shared by the upper cell row and the lower cell row, the upper cell row is designed inverted upside down as compared with the lower cell row. The contact regions 1 and 2 as illustrated in FIG. 3 are located to be inwardly displaced from the centers of the substrate regions 7 and 8 in the longitudinal direction at the location where the substrate regions 7 and 8 have minimum widths. This is because the interval 14 (as illustrated in FIG. 6) between adjacent contact regions must not be shorter than the allowable minimum interval that has been determined by the requirement of the manufacturing process thereof. On the other hand, if the interval 14 is designed wider than that as required, the cell size of the standard cells in the longitudinal direction becomes unnecessarily large so that the allowable minimum interval should be selected unless there is some other constraint requiring the large size. For example, the location of the respective contact regions are determined in order to satisfy $(C/2) \leq L \leq C$ where C is the minimum allowable interval between adjacent contact regions; and L is the distance between the perimeter of the contact region and the center of the substrate region in the longitudinal direction at the location where the substrate region has the minimum width.

Figure 7:
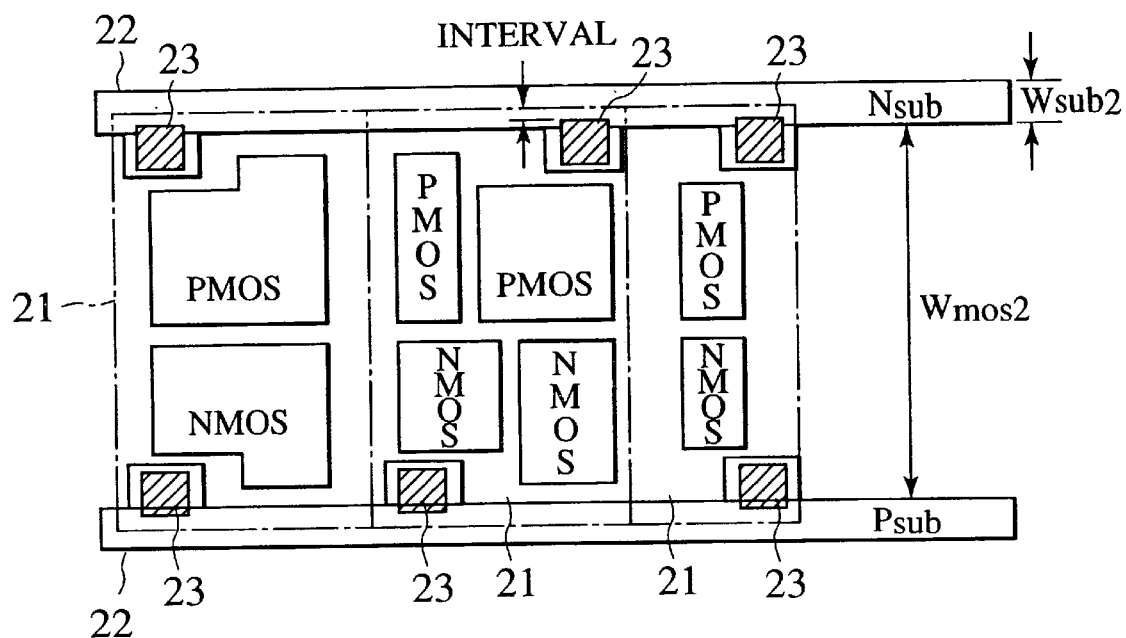
FIG. 7 is a plan view showing the configuration of the semiconductor integrated circuit in accordance with another embodiment of the present invention.

FIG. 7 is a plan view showing the configuration of the semiconductor integrated circuit in accordance with another embodiment of the present invention. In the figure, the respective standard cells are provided with substrate regions 22 in the upper and lower sides thereof and closely arranged in the lateral direction without any gap in order that the upper substrate regions 22 of the respective standard cells are united into one upper substrate region while the lower substrate regions 21 of the respective standard cells are united into one lower substrate region. The contact regions 23 are formed on portions of the substrate regions 22 where the widths of the substrate regions 22 are expanded to be wider than the minimum width thereof. In other words, the substrate regions 22 are not only located in the upper and lower sides of the respective standard cells but also partially extending in the longitudinal direction and partially cutting between the standard cells adjacent to each other.

Figure 8:
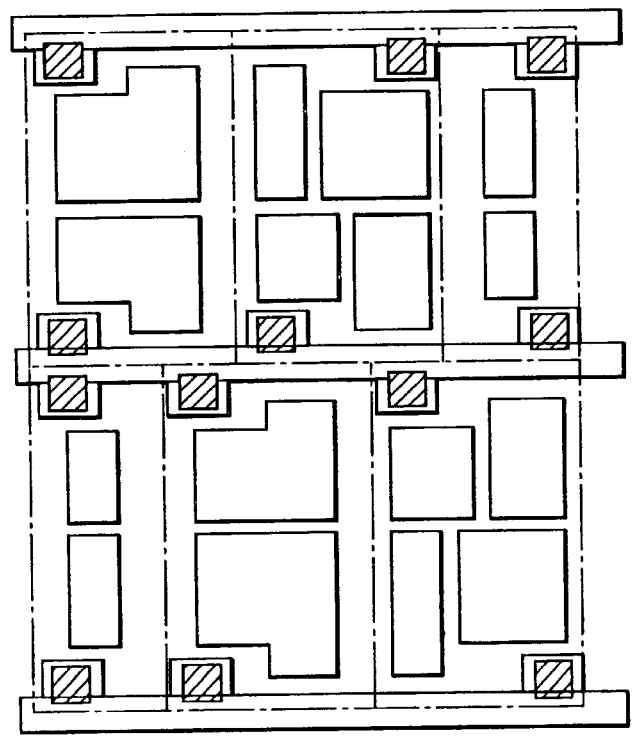
FIG. 8 is a plan view showing the configuration of the semiconductor integrated circuit in which are illustrated two cell rows which are designed as illustrated in FIG. 7.

The contact regions 23 on the substrate regions 22 are located displaced respectively from the center positions of the substrate regions 22 in the longitudinal direction at the location where the substrate regions 22 have minimum widths. It is required to displace the perimeters of the respective contact regions from the center positions of the substrate regions 22, at the location where the substrate regions 22 have minimum widths, by an interval no narrower than one half the minimum allowable interval between adjacent contact regions on the substrate region for complying with mask design rules. FIG. 8 is a plan view showing the configuration of the semiconductor integrated circuit in which are illustrated two cell rows which are designed as illustrated in FIG. 7.

In accordance with the layout as illustrated in FIG. 7, as compared with the conventional layout, the width of the substrate region can be reduced (see Wsub2 as illustrated in FIG. 7) so that the height of the area available to MOS transistors is increased as compared in the case with the same height of the standard cell row (see Wmos2 as illustrated in FIG. 7). On the other hand, the width of the substrate region becomes wider than that in accordance with the conventional technique at the location where the contact regions are provided so that the area available to MOS transistors is decreased. In the case of small-sized cells (i.e., having narrow widths), the area available to MOS transistors is sometimes decreased as compared in the case with the same height of the standard cell row in accordance with the conventional technique. However, in many cases, the area available to MOS transistors is increased by the configuration in accordance with the present invention. Namely, in accordance with the layout as illustrated in FIG. 7 and FIG. 8, the sizes of MOS transistors can be increased, if comparison is made with the same cell size, to improve the processing speed while if comparison is made with the same transistor size a higher packing density can be realized by shrinking the cell size.

Figure 9:
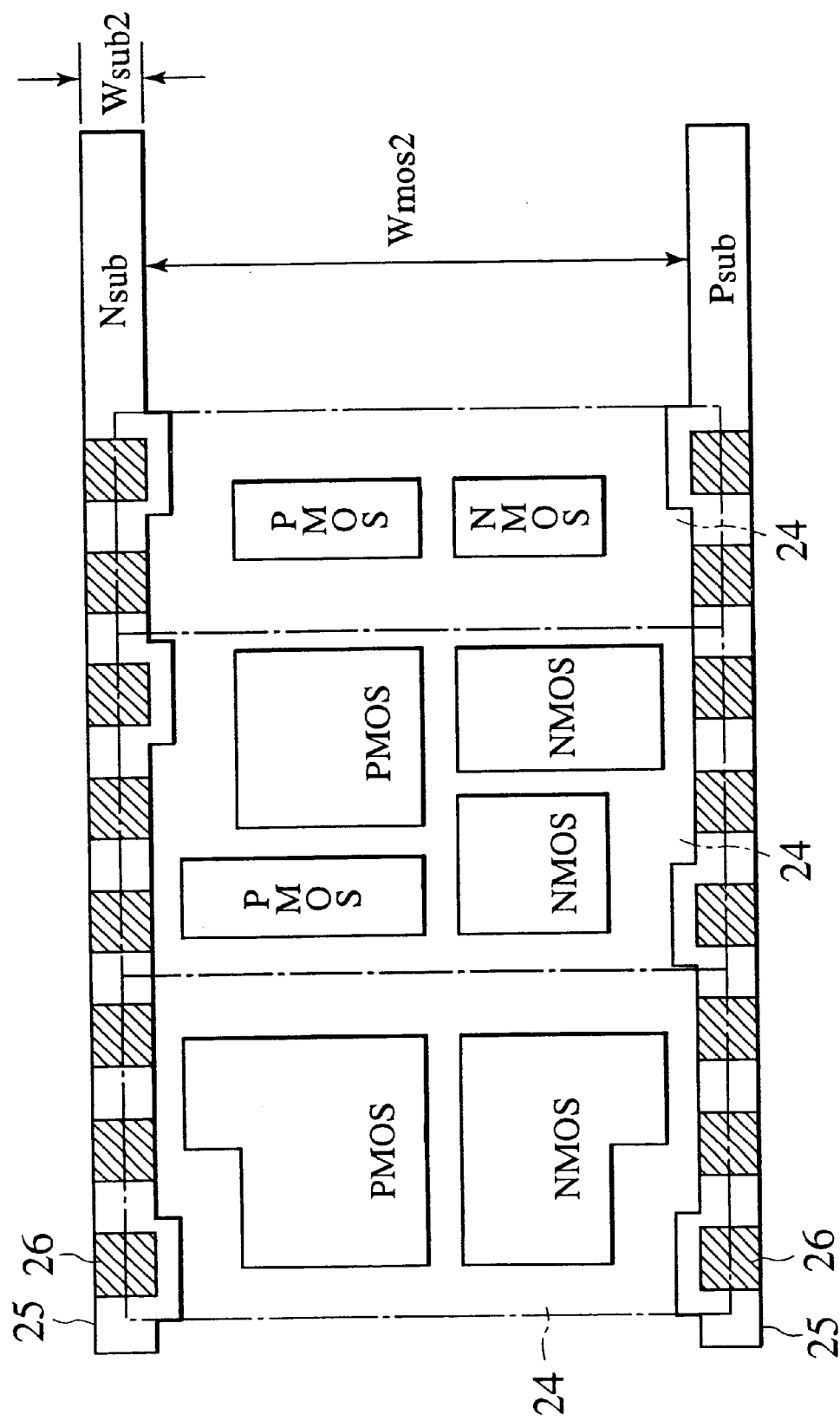
FIG. 9 is a plan view showing the configuration of the semiconductor integrated circuit in accordance with a further embodiment of the present invention.

FIG. 9 is a plan view showing the configuration of the semiconductor integrated circuit in accordance with a further embodiment of the present invention. In FIG. 9, contact regions 26 are located a constant distance apart from each other on the substrate region 25 in the upper and lower sides of the respective standard cells 24. The widths of the substrate regions 25 are expanded only in the locations where the standard cells in the locations can afford spaces for expansion of the substrate region 25 between the substrate region 25 and PMOS and NMOS active regions.

The layout as illustrated in FIG. 9 has similar advantages as the layout as illustrated in FIG. 7. While the layout as illustrated in FIG. 7 is described in the case where the contact regions 23 have to be located sufficiently inside respective to the substrate region 22 in order to comply with mask design rules, the layout as illustrated in FIG. 9 is effective in the case where it is desired to allow some misalignment of a mask for forming the contact regions 26 to the substrate region 25.

Figure 10A:
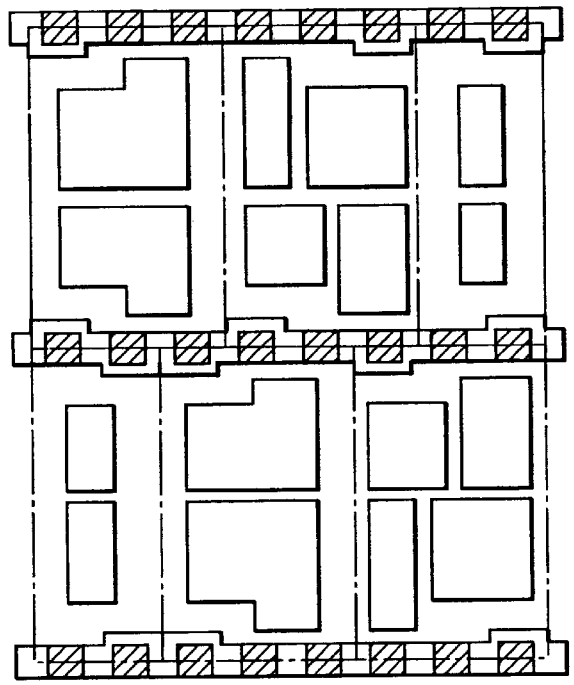
FIG. 10 is a plan view showing the configuration of the semiconductor integrated circuit in which are illustrated two cell rows which are designed as illustrated in FIG. 9.
Figure 10B:
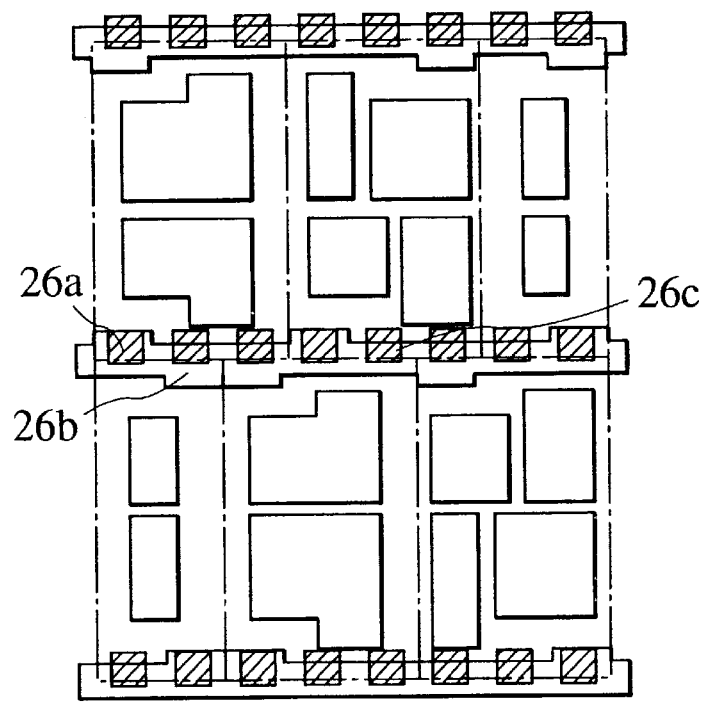

FIG. 10 is a plan view showing the configuration of the semiconductor integrated circuit in which are illustrated two cell rows which are designed as illustrated in FIG. 9. FIG. 10(a) is a plan view showing the configuration of the semiconductor integrated circuit in which no mask misalignment occurs while FIG. 10(b) is a plan view showing the configuration of the semiconductor integrated circuit in which a mask misalignment occurrs resulting in the contact regions are displaced upwardly. In the case as illustrated in FIG. 10(b), part of the contact regions 26b and 26c are shifted out from the substrate region and may sometimes be disconnected from the substrate region. However, the contact region 26a is located on the portion of the substrate region where the width thereof has been expanded upwardly so that it can maintain necessary electrical connection with the substrate region even with some misalignment. Also, the contact region 26b is located on the portion of the substrate region where the width thereof has been expanded downwardly so that it can maintain necessary electrical connection with the substrate region even with some downward misalignment, not shown in the figure.

In accordance with the layout as illustrated in FIG. 7, since the contact regions 23 have to be displaced from the center positions of the substrate regions 22 so that the widths of the substrate regions 22 must be expanded to accommodate the contact regions 23 to comply with the design rule. However, if the design rule is such as allowing some misalignment of the contact region to the substrate region, the expansion of the substrate region can be minimized by designing the layout as illustrated in FIG. 9 and therefore it is possible to suppress the size of the constituent standard cells and increase the size of the constituent transistors.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. A semiconductor integrated circuit including a plurality of standard cells which are arranged adjacent to each other in a cell row and comprising a plurality of MOS transistors, each standard cell of said cell row being provided with at least one first contact region through which at least one of said MOS transistors is electrically connected to a power potential, at least one second contact region through which at least one of said MOS transistors is electrically connected to a ground potential and first and second substrate regions located in upper and lower sides of the standard cell, wherein said first substrate region is provided with at least one contact region through which said first substrate region is electrically connected to said power potential while said second substrate region is provided with at least one contact region through which said second substrate region is electrically connected to said ground potential, wherein said first substrate region of said each standard cell is joined to the first substrate region of an adjacent cell of said cell row located adjacent to said each standard cell in order to form a first continuous region extending along said cell row in parallel while the second substrate region of said each standard cell is joined to the second substrate region of said adjacent cell in order to form a second continuous region extending along said cell row in parallel, wherein said first contact region of said each standard cell is located beyond the boundary line between said each standard cell and said adjacent cell and shared by said each standard cell and said adjacent cell to function also as the first contact region of said adjacent cell, wherein said at least one contact region of said first substrate region of said each standard cell is located to be inwardly displaced from the centers of said first substrate region in the longitudinal direction at the location where said first substrate region has a minimum width and functions also as said first contact region of said each standard cell, and wherein said at least one contact region of said second substrate region of said each standard cell is located to be inwardly displaced from the centers of said second substrate region in the longitudinal direction at the location where said second substrate region has a minimum width and functions also as said second contact region of said each standard cell.

2. The semiconductor integrated circuit as claimed in claim 1 wherein there is a vacant area where no functional cell is arranged in said cell row.

3. The semiconductor integrated circuit as claimed in claim 2 wherein said vacant area is padded with an inoperative cell which causes no operation.

4. The semiconductor integrated circuit as claimed in claim 3 wherein said inoperative cell is provided with a substrate region and a contact region.

5. The semiconductor integrated circuit as claimed in claim 1 wherein the widths of said first and second substrate regions have widths narrower than that as required for forming contact regions thereon under constraints determined by manufacture processes.

6. The semiconductor integrated circuit as claimed in claim 1 wherein the perimeters of said contact regions of said first and second substrate regions are displaced from the center positions of said first and second substrate regions by an interval no narrower than one half of a minimum allowable interval for complying with mask design rules.

7. The semiconductor integrated circuit as claimed in claim 1 wherein said contact regions of said first and second substrate regions are located inwardly displaced from the inner perimeters of said first and second substrate regions at the location where the substrate regions 7 and 8 have minimum widths.

* * * * *